US010818265B2

(12) United States Patent
Liu et al.

(10) Patent No.: US 10,818,265 B2
(45) Date of Patent: Oct. 27, 2020

(54) DISPLAYING A LOGO ON A SCREEN OF A DUAL-SCREEN DEVICE

(71) Applicant: Dell Products L. P., Round Rock, TX (US)

(72) Inventors: Yung Chun Liu, Taipei (TW); Jace W. Files, Round Rock, TX (US); John Trevor Morrison, Round Rock, TX (US)

(73) Assignee: Dell Products L. P., Round Rock, TX (US)

(*) Notice: Subject to any disclaimer, the term of this patent is extended or adjusted under 35 U.S.C. 154(b) by 0 days.

(21) Appl. No.: 16/247,636

(22) Filed: Jan. 15, 2019

(65) Prior Publication Data

US 2020/0227000 A1 Jul. 16, 2020

(51) Int. Cl.
  *G09G 5/00* (2006.01)
  *G06F 3/14* (2006.01)
  *H04N 5/58* (2006.01)
  *H05K 5/00* (2006.01)
  *G06K 9/00* (2006.01)
  *H05K 5/02* (2006.01)

(52) U.S. Cl.
  CPC .......... *G09G 5/006* (2013.01); *G06F 3/1438* (2013.01); *G06K 9/00221* (2013.01); *H04N 5/58* (2013.01); *H05K 5/0017* (2013.01); *H05K 5/0226* (2013.01); *G09G 2360/04* (2013.01)

(58) Field of Classification Search
  CPC .. G09G 5/006; G09G 2360/04; G06F 3/1438; G06K 9/00221; H04N 5/58; H05K 5/0017; H05K 5/0226
  See application file for complete search history.

(56) References Cited

U.S. PATENT DOCUMENTS

| 10,015,650 | B2* | 7/2018 | Viswanathan | H04W 4/50 |
| 2007/0236411 | A1* | 10/2007 | Kurosaki | G06F 1/1601 345/30 |
| 2009/0102745 | A1* | 4/2009 | Chan | G09G 5/00 345/1.3 |
| 2011/0075342 | A1* | 3/2011 | Gotham | H05K 5/02 361/679.21 |
| 2012/0297224 | A1* | 11/2012 | Chen | G06F 1/3206 713/322 |
| 2013/0329359 | A1* | 12/2013 | Andre | G06F 1/1616 361/679.55 |

(Continued)

*Primary Examiner* — Afroza Chowdhury
(74) *Attorney, Agent, or Firm* — Campbell Stephenson LLP; Shiv S. Naimpally

(57) ABSTRACT

In some examples, a computing device includes a first display device coupled to a second display device by a hinge. The computing device may use a facial recognition application to analyze image data from an imaging sensor in a bezel of the second display device to determine that the image data excludes a face of the user and determine that the second display device is not being viewed by the user. The computing device may determine an amount of ambient light falling on the second display device based on an ambient light sensor in the bezel of the second display device. A graphical image, such as a corporate logo, may be displayed on the second display device with a particular brightness amount that is determined based on the amount of the ambient light falling on the second display device.

20 Claims, 11 Drawing Sheets

(56) References Cited

U.S. PATENT DOCUMENTS

| | | | | |
|---|---|---|---|---|
| 2014/0002365 A1* | 1/2014 | Ackley | ............... | G09G 5/006 |
| | | | | 345/168 |
| 2015/0006872 A1* | 1/2015 | Sonobe | ............... | G06F 9/4401 |
| | | | | 713/2 |
| 2015/0116362 A1* | 4/2015 | Aurongzeb | ............. | H04N 7/15 |
| | | | | 345/650 |
| 2015/0116364 A1* | 4/2015 | Aurongzeb | ........... | G06F 3/0487 |
| | | | | 345/659 |
| 2015/0243202 A1* | 8/2015 | Lombardi | ............ | G09G 3/2092 |
| | | | | 345/520 |
| 2016/0130849 A1* | 5/2016 | Cheah | ............... | E05D 11/0081 |
| | | | | 361/679.27 |
| 2019/0042066 A1* | 2/2019 | Kim | .................... | G06F 1/1649 |

\* cited by examiner

DISPLAYING A LOGO ON A SCREEN OF A DUAL-SCREEN DEVICE

BACKGROUND OF THE INVENTION

Field of the Invention

This invention relates generally to computing devices and, more particularly, to displaying a logo (e.g., a corporate logo or a custom graphical image) on a screen (e.g., an unused or unviewed screen) of a portable computing device that includes two (or more) screens (e.g., display devices).

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For a portable computing device (e.g., a smartphone, a tablet, a laptop, or the like), a manufacturer may emboss a logo on a rear-surface of the primary screen (e.g., display device) of a single screen computing device or a dual-screen computing device. A dual-screen computing device may use a hinge capable of rotating between about 0 degrees to about 360 degrees to attach a first screen to a second screen of the dual-screen computing device. For such a device, an embossed logo may be not be visible in some orientations (e.g., configurations). For example, if the user rotates the first screen approximately 360 degrees relative to the second screen, such that each screen is facing 180 degrees from each other, the embossed logo may not be visible. The logo provides a way for the manufacturer to advertise and market a product, such as a computing device, at a very low cost. Thus, device orientations that block the embossed logo from being viewed by other users deprives the manufacturer of the opportunity to advertise and market the computing device.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device includes a first display device coupled to a second display device by a hinge. The computing device may use a facial recognition application to analyze image data from an imaging sensor in a bezel of the second display device to determine that the image data excludes a face of the user and determine that the second display device is not being viewed by the user. The computing device may determine an amount of ambient light falling on the second display device based on an ambient light sensor in the bezel of the second display device. A graphical image, such as a corporate logo, may be displayed on the second display device with a particular brightness amount that is determined based on the amount of the ambient light falling on the second display device.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
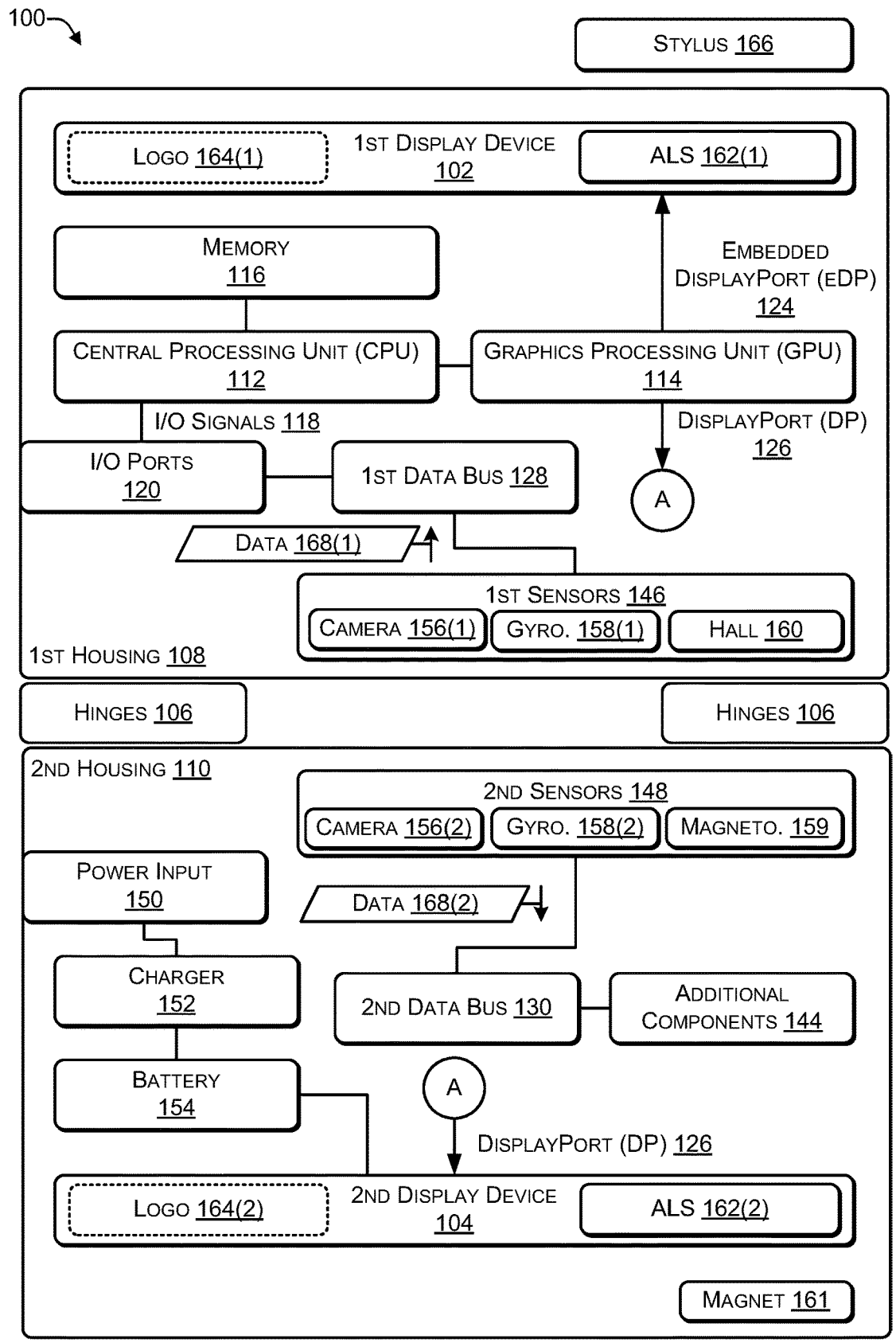
FIG. 1 is a block diagram of an architecture of a dual-display computing device according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

A dual-screen (e.g., dual-display) computing device (e.g., a type of IHS), may include various sensors, such as, for example, a gyroscope, a camera (or other imaging sensor), an ambient light sensor, a hinge-angle sensor, and the like. A central processing unit (CPU) of the dual-screen computing device may receive sensor data from the sensors when one or more of the sensors detect a change in orientation, e.g., when user picks up and holds the device, when the user places the device on a surface (e.g., of a table), when an angle between a first screen and a second screen of the device changes, and the like. As the CPU receives the sensor data from the sensors, the CPU may repeatedly determine a current orientation of the device.

When the CPU determines that a current orientation of the device is an orientation in which the embossed logo (e.g., an external permanent logo) is not visible to other users, the CPU may display a logo (e.g., a corporate logo or another type of graphical image) on a screen that is not being viewed (e.g., unused) by a user of the device. For example, in a tablet orientation, the first screen is rotated about 360 degrees relative to the second screen, enabling the user to view one of the screens. In this orientation, the other of the screens faces away from the user and is therefore not viewable by the user. In this orientation, the CPU may display the logo on the screen that faces away from or is not viewable by the user.

The CPU may determine the orientation of the device and determine whether to display the logo in a variety of ways. For example, an outer edge of one screen may include a magnet and an outer edge of the other screen may include a Hall-effect (or other magnetically sensitive) sensor, such that when one screen is rotated about 360 degrees relative to the other screen, the Hall-effect sensor detects the presence of the magnet and sends data to the CPU. In response, the CPU may determine that the device has been placed in a tablet orientation. As another example, the device may include a clasp, such that when one screen is rotated about 360 degrees relative to the other screen, clasp can be used to temporarily secure the one screen to the other screen in a tablet orientation. The clasp may include a sensor mechanism to determine when the clasp has been engaged and send sensor data to the CPU. For example, the clasp may include a magnet and the housing of the device may include a Hall-effect sensor to sense the presence of the magnet when the clasp is engaged. In response to receiving data from the Hall-effect sensor, the CPU may determine that the device has been placed in a tablet orientation.

A gyroscope ("gyro") sensor located inside the device may provide gyro data to the CPU. Based on the gyro data, if the CPU determines that the longest edge (e.g. length) of a screen is approximately parallel to the earth's surface, the CPU may determine that the device has a horizontal orientation and display the logo accordingly, e.g., such that the logo is horizontally oriented for a second user viewing a screen displaying the logo. Based on the gyro data, if the CPU determines that the longest edge (e.g. length) of a screen is approximately perpendicular to the earth's surface, the CPU may determine that the device has a vertical orientation and display the logo accordingly, e.g., such that the logo is vertically oriented for a second user viewing a screen displaying the logo.

The bezel surrounding each screen of the dual-screen device may include an imaging sensor (e.g., a camera sensor). The CPU may receive image data from each of the imaging sensors and determine (e.g., based on facial recognition) a location of a user, e.g., determine which one of the screens the user is facing. For example, if an image (e.g., sensor data) provided by a camera embedded in a bezel surrounding a particular screen includes a face of a user associated with the device, then the CPU may determine that the user is facing the particular screen. If an image (e.g., sensor data) provided by a camera embedded in a bezel surrounding a particular screen does not include the face of the user, then the CPU may determine that the user of the device is not facing the particular screen.

The CPU may receive ambient light data indicating an amount of ambient light striking the screen that is not being viewed by the user of the device. The ambient light data may be sent by an ambient light sensor (ALS) located in a bezel of the screen. Based on the ambient light data, the CPU may determine an intensity (e.g., a brightness level) with which to display the logo. For example, when the device is located in a relatively dark environment where the amount of ambient light is relatively low (e.g., a darkened room, outside at night, or the like), the CPU may display the logo with a relatively low intensity level, e.g., to reduce power consumption and prolong battery life. When the device is located in a relatively well-lit environment where the amount of ambient light is relatively high (e.g., a room in which the lights are on, outside during a sunny day, or the like), the CPU may display the logo with a relatively high intensity level, e.g., to enable the logo to be seen by others in the environment. If the dual screen device uses organic light emitting diode (OLED) panels as the screens, when the logo is displayed, only the pixels used to display the logo consume energy while the remaining pixels do not consume power. Thus, displaying the logo at a high intensity in a relatively well-lit environment may not consume a relatively large amount of power.

As a first example, a computing device may include a first display device coupled to a second display device by one or more hinges that enable the first display device to be placed at an angle between about 0 degrees to about 360 degrees relative to the second display device. The computing device may include a memory storing instructions that are executable by one or more processors to perform various operations. For example, the operations may include determining that the computing device has moved from a first orientation to a second orientation. The operations may include determining that the second orientation is either (i) a tablet orientation or (ii) a tent orientation. For example, in the tablet orientation, the first display device is facing in a first direction and the second display device is facing in a second direction that is about 180 degrees from the first direction. The operations may include determining that a user associated with the computing device is viewing the first display device. For example, determining that the user is viewing the first display device may include receiving first image data from a first imaging sensor located in a first bezel of the first display device, determining, using a facial recognition application, that the first image data includes a face of the user, and determining that the user is viewing the first display device. As another example, determining that the user is viewing the first display device may include receiving second image data from a second imaging sensor located in a second bezel of the second display device, determining, using the facial recognition application, that the second image data excludes the face of the user associated with the computing device, determining that the user is not viewing the second display device, and determining (e.g., inferring) that the user is viewing the first display device. The operations may include receiving ambient light data indicating an amount of ambient light falling on the second display device and determining, based on the ambient light data, a particular brightness amount. The ambient light data is received from an ambient light sensor located in a bezel of the second display device. The operations may include displaying a graphical image on the second display device. The graphical image may have the particular brightness amount. For example, the graphical image may be a corporate logo of a manufacturer of the computing device or a purchaser of the computing device. The operations may include determining that the computing device has been rotated about 90 degrees and rotating the graphical image about 90 degrees.

As a second example, a computing device may include a first display device, a second display device, one or more hinges coupling the first display device to the second display device, a first bezel of the first display device, a second bezel of the second display device, a Hall-effect sensor, a magnet, one or more non-transitory computer-readable storage media (e.g., memory), and one or more processors. The one or more hinges enable the first display device to be placed at an angle between about 0 degrees to about 360 degrees relative to the second display device. The first bezel may include a first imaging sensor and a first ambient light sensor. The second bezel may include a second imaging sensor and a second ambient light sensor. The one or more non-transitory computer readable media may store instructions executable by the one or more processors to perform various operation. For example, the instructions may include determining that the computing device has moved from a first orientation to a second orientation. The operations may include determining that the second orientation comprises an orientation in which either the first display device or the second display device is not being viewed by the user of the device. For example, in response to receiving data indicating that the Hall-effect sensor has detected the magnet, the operations may include determining that the second orientation comprises a tablet orientation. The operations may include determining that the second display device is not being viewed by the user that is associated with the computing device. For example, determining that the second display device is not being viewed may include receiving first image data from the first imaging sensor, determining, using a facial recognition application, that the first image data includes a face of the user, determining that the first display device is being viewed by the user associated with the computing device, and determining that the second display device is not being viewed by the user. As another example, determining that the second display device is not being viewed by the user may include receiving image data from the second imaging sensor, determining, using a facial recognition application, that the image data excludes a face of the user associated with the computing device, and determining (e.g., inferring) that the second display device is not being viewed by the user. The operations may include determining, using the second ambient light sensor, an amount of ambient light falling on the second display device. The operations may include determining, based on the amount of the ambient light falling on the second display device, a particular brightness amount. The operations may include displaying a graphical image on the second display device with the particular brightness amount. The graphical image may include a corporate logo of a manufacturer of the computing device or a purchaser of the computing device. The operations may include determining that the computing device has been rotated about 90 degrees and rotating the graphical image about 90 degrees. The operations may include determining a remaining battery level of a battery that is powering the computing device. In response to determining that the remaining battery level satisfies a first threshold (e.g., between about 50% to about 30% remaining battery life), the operations may include reducing the particular brightness amount of the logo. In response to determining that the remaining battery level satisfies a second threshold (e.g., less than 20% remaining battery life), the operations may include stopping displaying the logo.

FIG. 1 is a block diagram of an architecture of a dual-display (e.g., dual-screen) computing device according to some embodiments. In some implementations, the computing device 100 may include two (or more) housings while in other implementations the computing device 100 may include a single housing (e.g., a tablet form factor). As illustrated in FIG. 1, the computing device 100 may include a first housing 108 coupled to a second housing 110 via one or more hinges 106 (or other mechanical coupling mechanism). The hinges 106 may enable the two housings 108, 110 to be positioned at different angles relative to each other in different orientations (e.g., various vertical orientations and various horizontal orientations). Of course, additional housings may be attached via additional hinges (or other mechanical coupling mechanism) to create a computing device with multiple housings.

A first display device 102 may be located in the first housing 108 and, in some cases, a second display device 104 may be located in the second housing 110. A first portion of the components of the computing device 100 may be located in the first housing 108 (e.g., behind the first display device 102) while a remaining portion of the components of the computing device 100 may be located in the second housing 110 (e.g., behind the second display device 104). For example, as illustrated in FIG. 1, the components located in the first housing 108 may include at least one central processing unit (CPU) 112, a graphics process unit (GPU) 114, and a memory (e.g., computer-readable media) 116. The GPU 114 may be integrated into the CPU 112 or may be a separate device from the GPU 114. The CPU 112 may communicate input/output (I/O) signals 118 via multiple I/O post 120. The I/O ports 120 may include video ports (e.g., a video graphics adapter (VGA) port, a digital video interface (DVI) port, a high definition media interface (HDMI) port, a ThunderBolt® port, or the like), audio ports (e.g., microphone jack, headphone jack, and the like), data ports (e.g., universal serial bus (USB) ports compliant with USB 2.0, USB 3.0, and the like), communication ports (e.g., Ethernet and the like), another type of port, or any combination thereof. In some cases, the computing device 100 may include at least one digital signal processing (DSP) processor 122 to perform audio (and video) signal processing. The GPU 114 may provide two or more lanes of embedded DisplayPort (eDP) output 124 that are sent to the first display device 108 in the first housing 108 and two or more lanes of DisplayPort (DP) output 126 that are sent (e.g., wirelessly or via a cable) to the second display device 110 in the second housing 110.

A first data bus 128 in the first housing 108 and a second data bus 130 in the second housing 110 may distribute data among the various components of the computing device 100. For example, the data buses 128, 130 may distribute data from the I/O signals 118, the I/O ports 120, a first set of sensors 146, a second set of sensors 148, and additional components 144. For example, the data buses 128, 130 may distribute data by receiving data from a component of the computing device 100 and transmitting the data to one or more of the other components of the computing device 100.

The second housing 110 may include a remaining portion of the components of the computing device 100. In some cases, the components in the second housing 110 may be located behind the second display device 104. The second housing 110 may include the additional components 144 (e.g., keyboard, touchpad, trackball, speaker, microphone, Wi-Fi antenna, Bluetooth antenna, Zigbee Antenna, cellular antenna, and the like), the second set of sensors 148, a power input 150 (e.g., alternating current (AC) or direct current (DC) input), a charger 152, and a battery 154. The battery charger 152 may be used as a power source to provide power instead of (or in addition to) the battery 154 when the battery 154 is depleted or inoperable. In some cases, data cables may run through the hinges 106 to connect the components of the computing device 100 located in the first housing 108 with the components of the computing device 100 located in the second housing 110. In other cases, a first wireless transceiver in the first housing 108 and a second wireless transceiver in the second housing 110 may provide wireless communications between (1) the components of the computing device 100 located in the first housing 108 and (2) the components of the computing device 100 located in the second housing 110.

The first set of sensors 146 may include one or more of a camera (e.g., an imaging sensor) 156(1), a gyroscope 158(1), a Hall-effect (or another type of magnetically sensitive) sensor 160, an accelerometer, an electronic compass (e-compass), a barometer, a magnetometer, a proximity sensor, a ambient temperature sensor (e.g., to measure a ambient temperature within a predetermined distance of the first display device 102), a fingerprint sensor, a global positioning satellite (GPS) sensor, a sensor to detect movement of (e.g., detect a change in an angle between) the hinges 106, a proximity sensor, another type of sensor, or any combination thereof. The second set of sensors 148 may include one or more of a camera (e.g., an imaging sensor) 156(2), a gyroscope 158(2), an accelerometer, an electronic compass (e-compass), a barometer, a magnetometer 159, a proximity sensor, a ambient temperature sensor (e.g., to measure a ambient temperature within a predetermined distance of the first display device 102), a fingerprint sensor, a GPS sensor, a sensor to detect movement of (e.g., detect a change in an angle between) the hinges 106, a proximity sensor, another type of sensor, or any combination thereof. The first sensors 146 may provide sensor data 168(1) to the CPU 112 using the first data bus 128. The second sensors 148 may provide sensor data 168(2) to the CPU 112 using the second data bus 130.

The first housing 108 may include a magnet 161 and at least one ambient light sensor (ALS) 162(1) that is capable of measuring an amount of ambient light being received by a surface of the first display device 102. The magnet 161 may be located at a location in the housing 110 such that when the housing 110 is rotated about 360 degrees relative to the housing 108, e.g., such that the display device 104 is facing in a direction that is about 180 degrees from the display device 102, the Hall-effect sensor 160 is capable of sensing the proximity of the magnet 161. In this way, the Hall-effect sensor 160 enables the CPU 112 to determine when the housing 110 is rotated about 360 degrees relative to the housing 108. The first housing 108 may include one or more color sensors. The second housing 110 may include at least one ALS 162(2) that is capable of measuring an amount of ambient light being received by a surface of the second display device 104. The second housing 110 may include one or more color sensors. The color sensors may measure an intensity of light, chroma, and hue associated with each of the display devices 102, 104.

In FIG. 1, the first set of components of the computing device 100 shown as being located in the first housing 108 and the remaining set of components shown as located in the second housing 110 are purely for illustration purposes. Depending on the implementation, different components of the computing device 100 may be housed in one or both of the housings 108, 110. For example, when the computing device 100 is designed for graphics processing, the GPU 114 and supporting hardware (e.g., graphics support chips, graphics memory, and the like) may be housed in the second housing 110. As another example, in some cases, the ports 120 may be located in the first housing 108, in the second housing 110, or split between the two housings 108, 110. As a further example, the battery 154 may include multiple power cells, with a portion of the power cells located in the first housing 108 and zero or more of the power cells located in the second housing 110. In some cases, which components of the computing device 100 are located in each of the housings 108, 110 may be determined by the thermal characteristics of the components. For example, the components may be distributed between the housings 108, 110 to enable each of the housings 108, 110 to heat to approximately the same ambient temperature. Doing so may avoid grouping components that generate the most heat into the same housing, thereby causing one housing to be hotter than the other housing. The temperature sensors 160 may be used to determine a current ambient temperature (e.g., in Celsius or Fahrenheit) within each of the housings 108, 110, a current ambient temperature close to each of the display devices 102, 104, or both. The colors displayed by the display devices 102, 104 may change based on temperature.

The display devices 102, 104 may be configured to behave as independent display devices or the display device 104 may be configured as an extension of the display device 102 to enable both display devices to function as a single larger sized display device. The operating system of the computing device 100 may enable the user to "lock" a particular orientation (e.g., rotation) of the content being displayed on each display device to avoid the computing device 100 repeatedly re-orientating (e.g., rotating) the content as the user moves (e.g., re-positions) the computing device 100.

Software instructions implementing an operating system and one or more applications, including at least one application to reduce (or eliminate) perceived color differences between the display devices 102, 104, may be stored in the memory 116. The software instructions may be executed by the CPU 112, by the DSP processor 122, or any combination thereof.

Thus, the computing device 100 may include the first housing 108 coupled to the second housing 110 by one or more hinges 106 (or other mechanical coupling mechanism). The computing device 100 may include software that enables a user to use the computing device 100 with a stylus 166 in a manner similar to a pad of paper (or paper-based notebook) and ink-based pen (or graphite-based pencil). The various sensors 146, 148, such as, for example, gyroscopes, electronic compasses (e.g., magnetometers), accelerometers, and the like, may be used to determine the screen orientation for the computing device 100. The CPU 112 of the dual-screen computing device 100 may receive the sensor data 168 from the sensors 146, 148 when one or more of the sensors detects a change in orientation, e.g., when a user picks up and holds the device 100, when the user places the device 100 on a surface (e.g., of a table), when an angle between the first housing 108 and the second housing 110 changes, and the like. As the CPU 112 receives the sensor data 168 from the sensors 146, 148, the CPU 112 may repeatedly determine a current orientation of the device 100.

When the CPU 112 determines that in a current orientation, an embossed logo (e.g., an external physical logo) is not visible to other users, the CPU 112 may display a logo 164 (e.g., a corporate logo or another type of graphical image) on one of the display devices 102, 104 that is not being viewed (e.g., unused) by a user of the device 100. For example, in a tablet orientation, the first display device 102 is rotated about 360 degrees relative to the second display device 104, enabling the user to view one but not both of the screens 102 or 104. In this orientation, the CPU 112 may display the logo 162 on one of the display devices 102, 104 that faces away from (or is not viewable by) the user. For example, if the CPU 112 determines, based on the sensor data 168 (e.g., from the cameras 156), that the user associated with the computing device is viewing the first display device 102 and that the second display device 104 is not being viewed by the user, then the CPU 112 may display the logo 164(2) on the second display device 104. If the CPU 112 determines, based on the sensor data 168 (e.g., from the cameras 156), that the user is viewing the second display device 104 and that the first display device 102 is not being viewed by the user associated with the computing device, then the CPU 112 may display the logo 164(1) on the first display device 102.

The logos 164 may be a corporate logo associated with a manufacturer of the computing device 100 or associated with a purchaser of the computing device 100. For example, if a corporation orders 1,000 computing devices, the information technology (IT) department of the corporation may use a user interface to create a customized graphical image, such as a logo of the corporation, that is displayed. As another example, an individual user may use the user interface to create a customized graphical image (e.g., an emoji of the user or a graphical image having a particular significance to the user).

Figure 2:
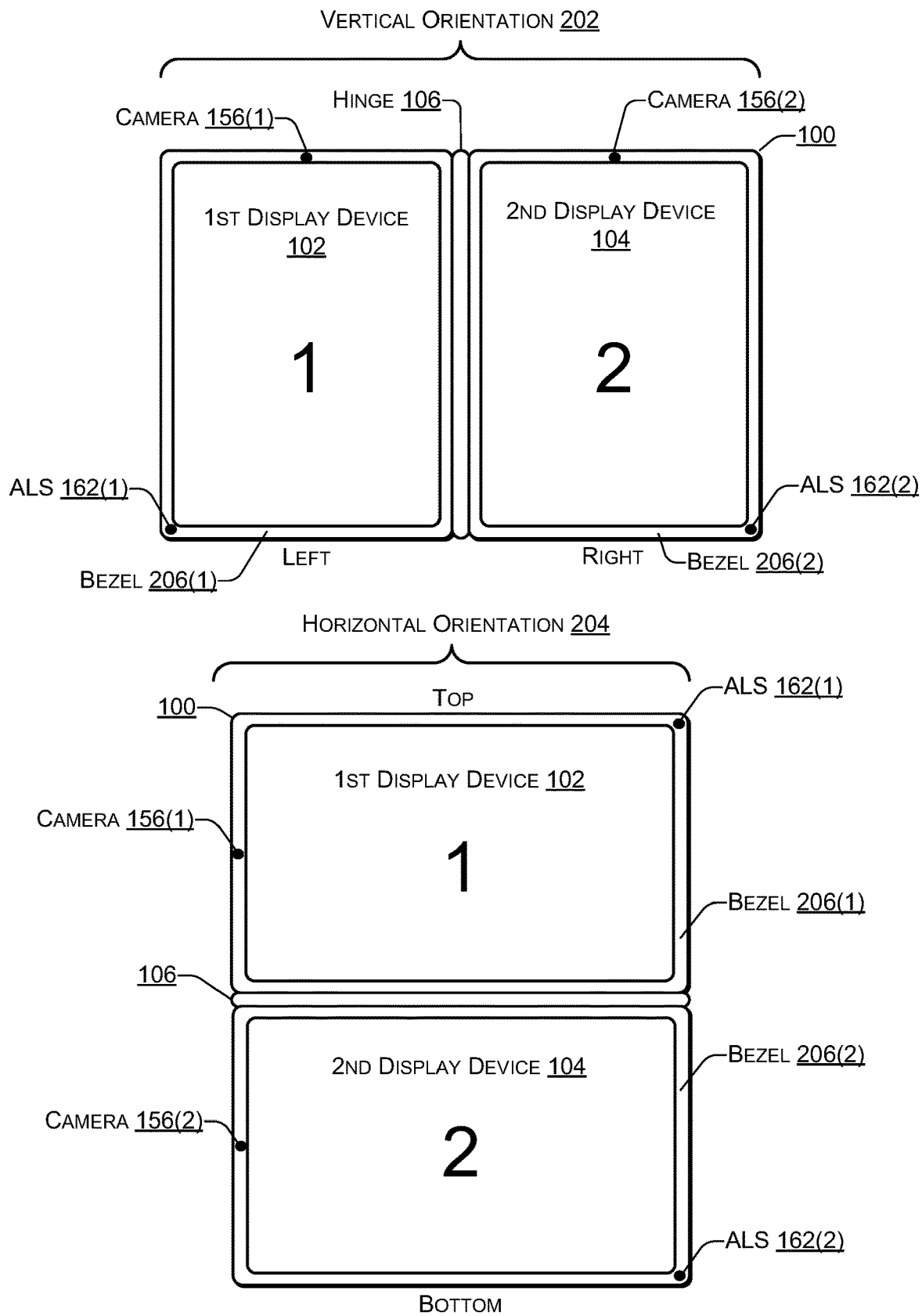
FIG. 2 is a block diagram illustrating different orientations of a dual-display device according to some embodiments.
Figure 3:
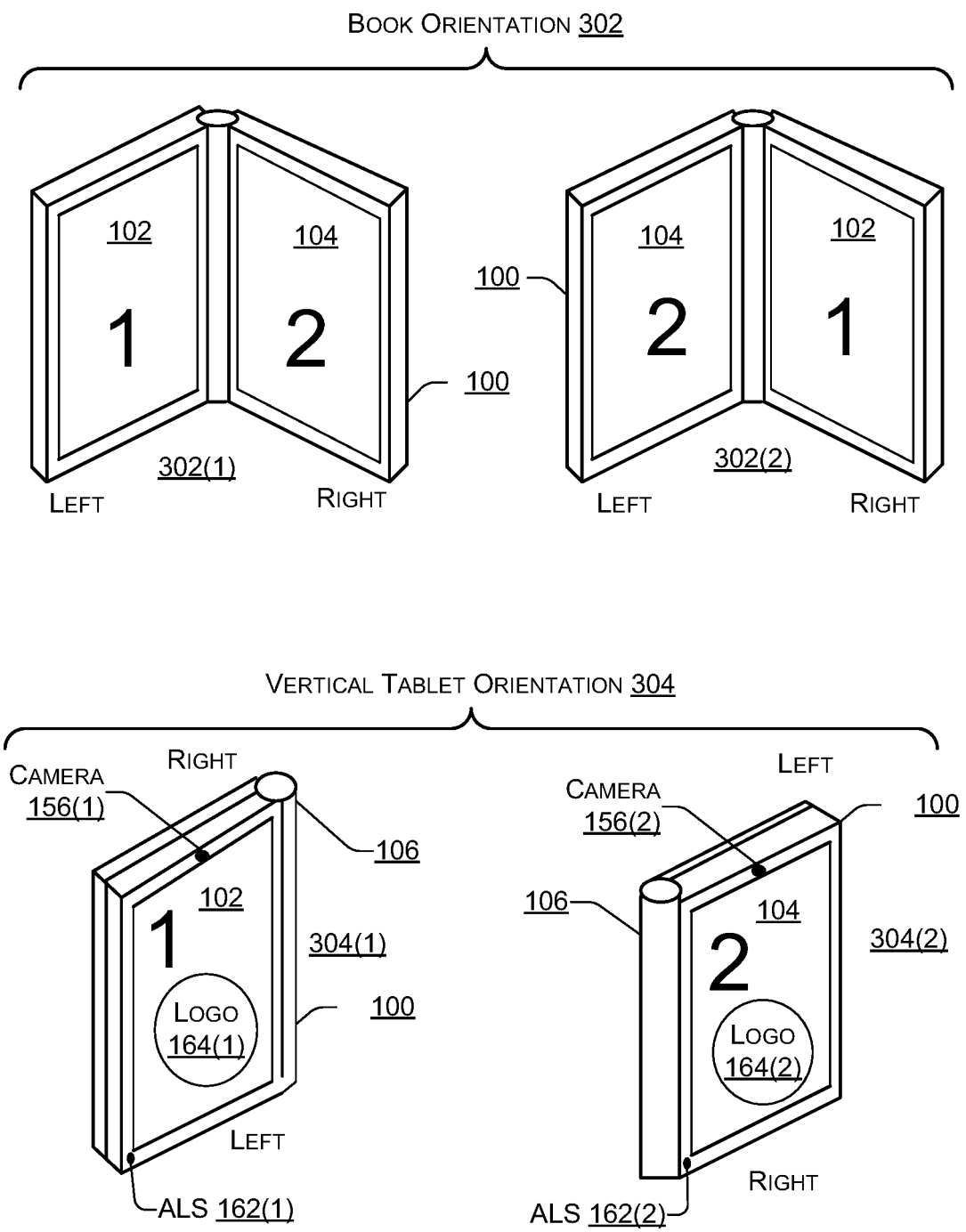
FIG. 3 is a block diagram illustrating modes of a dual-display device in a vertical orientation according to some embodiments.
Figure 4:
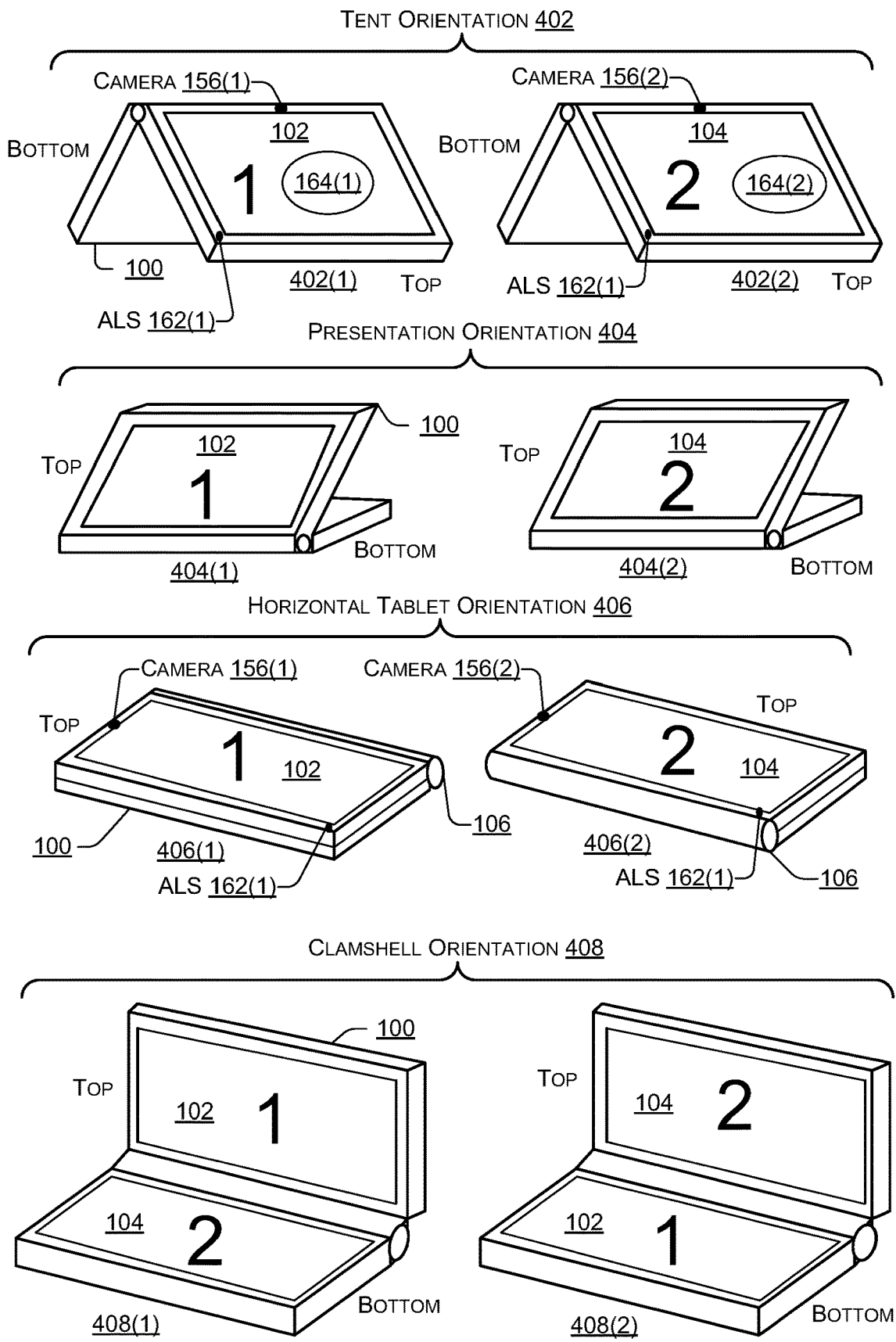
FIG. 4 is a block diagram illustrating modes of a dual-display device in a horizontal orientation according to some embodiments.

FIG. 2 is a block diagram 200 illustrating different orientations of a dual-display device (e.g., the computing device 100 of FIG. 1) according to some embodiments. The computing device 100 may include at least two display devices 102, 104. The computing device 100 may be displayed in a vertical (e.g., portrait) orientation 202 or a horizontal (e.g., landscape) orientation 204. For example, in the vertical orientation 202, the first display device 102 may be on one side (e.g., the left side or the right side), the second display device 104 may be on another side (e.g., the right side or the left side), and the hinge 106 may join the first display device 102 to the second display device 104. Additional examples of the vertical orientation 202 are illustrated in FIG. 3. In the horizontal orientation 204, the first display device 102 may be located at the top (or the bottom) of the computing device 100 with the hinge 106 in the middle and the second display device 104 may be located at the bottom (or the top) of the computing device 100. Additional examples of the horizontal orientation 204 are illustrated in FIG. 4.

A bezel 206(1) may surround the first display device 102 and a bezel 206(2) may surround the second display device 104. The camera 156(1) and the ALS 162(1) may be embedded into the bezel 206(1) and the camera 156(2) and the ALS 162(2) may be embedded into the bezel 206(2), as illustrated in FIG. 2.

FIG. 3 is a block diagram 300 illustrating additional vertical orientations of a dual-display device according to some embodiments. Additional examples of the vertical orientation 202 may include a book orientation 302 and a vertical tablet orientation 304. For example, in a first book orientation 302(1), the first display device 102 may be on the left and the second display device 104 may be on the right. Alternately, in a second book orientation 302(2), the second display device 104 may be on the left and the first display device 102 may be on the right.

In the vertical tablet orientation 304, the first display device 102 may be on the left and the second display device 104 may be on the right. In a first vertical tablet orientation 304(1), if the first display device 102 is facing a user, then the second display device 104 may be rotated approximately 360 degrees, e.g., facing away from the user. If sensor data from the camera 156(1) confirms that the user is not viewing the first display device 102, the logo 164(1) may be displayed on the first display device 102. An intensity (e.g., a brightness) of the logo 164(1) may be determined based on an amount of ambient light striking the first display device 102, as determined by sensor data from the ALS 162(1). For example, if the amount of ambient light is relatively low (e.g., relatively dark environment), then the logo 164(1) may be displayed with a relatively low intensity. If the amount of ambient light is relatively high, (e.g., relatively bright environment). then the logo 164(1) may be displayed with a relatively high intensity. If sensor data from the sensors indicates that the computing device 100 has been placed on a table (or another surface) with the second display device 104 facing down on the table (or other surface), then the logo 164 may not be displayed.

In a second vertical tablet orientation 304(2), the second display device 104 may be facing the user while the first display device 102 may rotated approximately 360 degrees to face away from the user. In the vertical tablet orientation 304(2), sensor data from the camera 156(2) may be used to determine that the user is not viewing the second display device 104. In response, the logo 164(2) may be displayed on the second display device 104. An intensity (e.g., a brightness) of the logo 164(2) may be determined based on an amount of ambient light striking the first display device 104, as determined by sensor data from the ALS 162(2). For example, if the amount of ambient light is relatively low (e.g., relatively dark environment), then the logo 164(2) may be displayed with a relatively low intensity. If the amount of ambient light is relatively high, (e.g., relatively bright environment). then the logo 164(2) may be displayed with a relatively high intensity. If sensor data from the sensors indicates that the computing device 100 has been placed on a table (or another surface) with the first display device 102 facing down on the table (or other surface), then the logo 164 may not be displayed.

In 304(1), 304(2), if the user re-orients the computing device 100 to a horizontal orientation, e.g., by turning the computing device 100 about ninety degrees to either the right or the left, one or more of sensors 146, 148 (e.g., the gyroscopes 158, the magnetometer 159, or the like) of FIG. 1, may determine that the computing device 100 has been re-oriented and adjust the displayed logo 164 accordingly. For example, if the sensors 146, 148 determine that the computing device 100 has been rotated (e.g., relative to a center of the computing device 100) about ninety degrees to the right, the logo 164 may be rotated about ninety degrees to the right. If the sensors 146, 148 determine that the computing device 100 has been rotated (e.g., relative to a center of the computing device 100) about ninety degrees to the left, the logo 164 may be rotated about ninety degrees to the left.

FIG. 4 is a block diagram 400 illustrating additional horizontal orientations of a dual-display device according to some embodiments. Additional examples of the horizontal orientation 204 may include a tent orientation 402, a presentation orientation 404, a horizontal tablet orientation 406, and a clamshell orientation 408.

In 402(1), the first display device 102 may be at the top facing the user while the second display device 104 may be at the bottom facing away from the user. In 402(2), the second display device 104 may be at the top facing the user and the first display device 102 may be at the bottom facing away from the user. In the tent orientation 402(1), sensor data from the camera 156(1) may be used to determine that the user is not viewing the first display device 102. In response, the logo 164(1) may be displayed on the first display device 102. An intensity (e.g., a brightness) of the logo 164(1) may be determined based on an amount of ambient light striking the first display device 102, as determined by sensor data from the ALS 162(1). For example, if the amount of ambient light is relatively low (e.g., relatively dark environment), then the logo 164(1) may be displayed with a relatively low intensity. If the amount of ambient light is relatively high, (e.g., relatively bright environment). then the logo 164(1) may be displayed with a relatively high intensity.

In 404(1), the first display device 102 may be at the top facing the user and the second display device 104 may be at the bottom facing down. In 404(2) the second display device 104 may be at the top facing the user and the first display device 102 may be at the bottom facing down. In the test orientation 402(2), sensor data (e.g., image data) from the camera 156(2) may be used to determine that the user is not viewing the second display device 104. In response, the logo 164(2) may be displayed on the second display device 104. An intensity (e.g., a brightness) of the logo 164(2) may be determined based on an amount of ambient light striking the first display device 104, as determined by sensor data from the ALS 162(2). For example, if the amount of ambient light is relatively low (e.g., relatively dark environment), then the logo 164(2) may be displayed with a relatively low intensity. If the amount of ambient light is relatively high, (e.g., relatively bright environment). then the logo 164(2) may be displayed with a relatively high intensity.

In 406(1), the first display device 102 may be facing the user and the second display device 104 may be facing away from the user. In the horizontal tablet orientation 406(1), sensor data from the camera 156(1) may be used to determine that the user is viewing the first display device 102. In response, the logo 164(2) may be displayed on the second display device 104. An intensity (e.g., a brightness) of the logo 164(2) may be determined based on an amount of ambient light striking the second display device 104, as determined by sensor data from the ALS 162(1). For example, if the amount of ambient light is relatively low (e.g., relatively dark environment), then the logo 164(2) may be displayed with a relatively low intensity. If the amount of ambient light is relatively high, (e.g., relatively bright environment). then the logo 164(2) may be displayed with a relatively high intensity. Based on sensor data from the sensors (e.g., gyro, magnetometer, or the like), if the computing device 100 determines that the computing device 100 has been placed on a surface (e.g., the user is not holding the computing device 100) with the second display device 104 facing down (e.g., towards the surface), then the logo 164(2) may not be displayed on the second display device 104.

In 406(2), the second display device 104 may be facing the user and the first display device 102 may be facing away from the user. In the horizontal tablet orientation 406(2), sensor data from the camera 156(2) may be used to determine that the user is viewing the second display device 104. In response, the logo 164(1) may be displayed on the first display device 102. An intensity (e.g., a brightness) of the logo 164(1) may be determined based on an amount of ambient light striking the first display device 104, as determined by sensor data from the ALS 162(2). For example, if the amount of ambient light is relatively low (e.g., relatively dark environment), then the logo 164(1) may be displayed with a relatively low intensity. If the amount of ambient light is relatively high, (e.g., relatively bright environment). then the logo 164(1) may be displayed with a relatively high intensity. Based on sensor data from the sensors (e.g., gyro, magnetometer, or the like), if the computing device 100 determines that the computing device 100 has been placed on a surface (e.g., the user is not holding the computing device 100) with the first display device 102 facing down (e.g., towards the surface), then the logo 164(2) may not be displayed on the first display device 102.

In 406(1), 406(2), if the user re-orients the computing device 100 to a vertical orientation, e.g., by turning the computing device 100 about ninety degrees to either the right or the left, one or more of sensors 146, 148 (e.g., the gyroscopes 158, a magnetometer, or the like) of FIG. 1, may determine that the computing device 100 has been re-oriented and adjust the displayed logo 164 accordingly. For example, if the sensors 146, 148 determine that the computing device 100 has been rotated (e.g., relative to a center of the computing device 100) about ninety degrees to the right, the logo 164 may be rotated about ninety degrees to the right. If the sensors 146, 148 determine that the computing device 100 has been rotated (e.g., relative to a center of the computing device 100) about ninety degrees to the left, the logo 164 may be rotated about ninety degrees to the left.

In 408(1), the first display device 102 may be at the top facing the user and the second display device 104 may be at the bottom facing the user (e.g., in a position where traditionally, a keyboard is located in a laptop). In 408(1), in some cases, a QWERTY-based keyboard may be displayed on the second display device 104 and used to receive keyboard input. In 408(2), the second display device 104 may be at the top facing the user and the first display device 102 may be at the bottom facing the user (e.g., in a position where traditionally, a keyboard is located in a laptop). In 408(2), in some cases, a QWERTY-based keyboard may be displayed on the first display device 102 and used to receive keyboard input.

Figure 5:
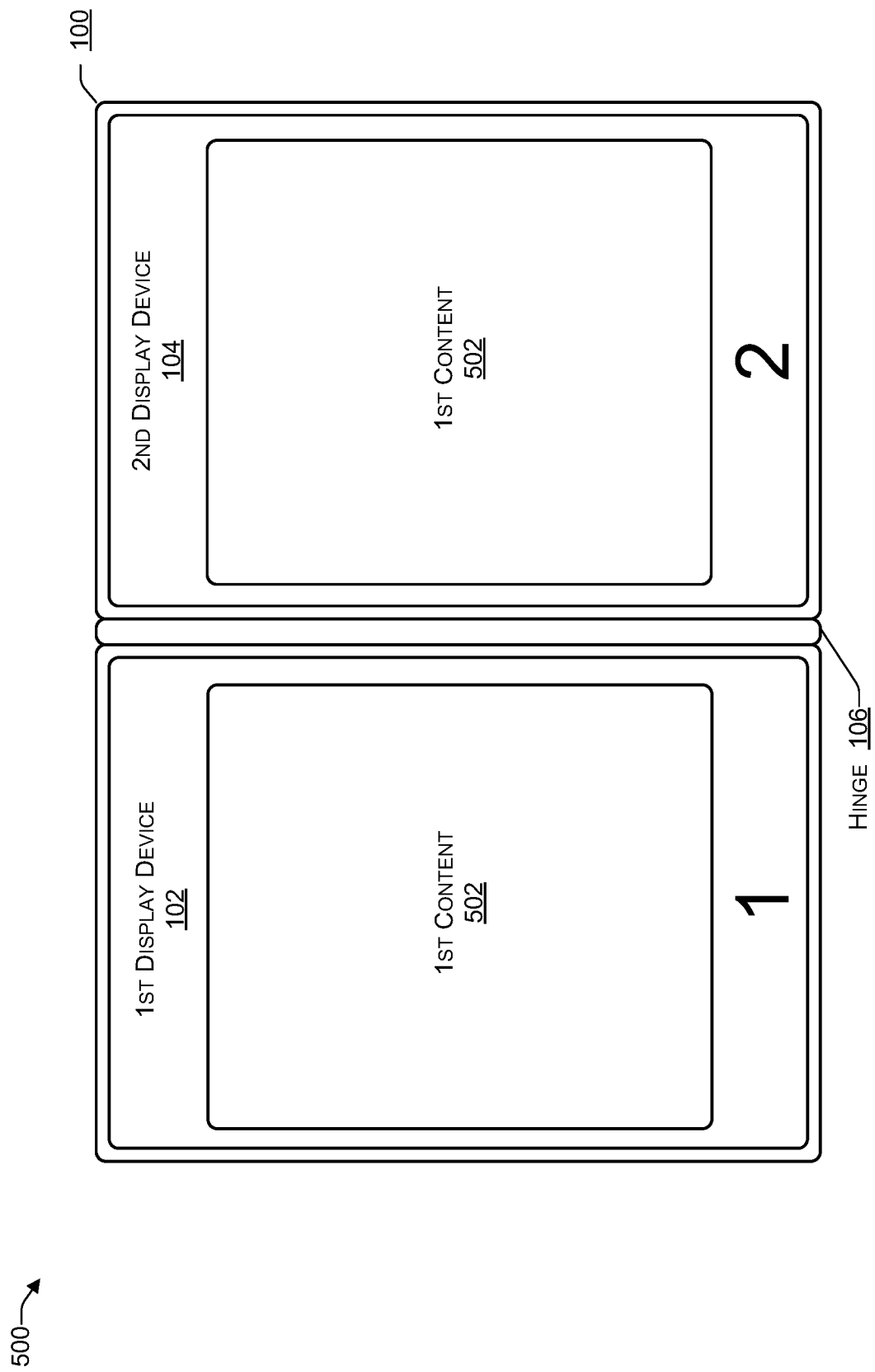
FIG. 5 is a block diagram illustrating a dual-display device in which the operating system is in a clone mode according to some embodiments.

FIG. 5 is a block diagram 500 illustrating a dual-display device in which the operating system is in a clone mode according to some embodiments. An operating system of the computing device 102, such as Microsoft® Windows®, may provide three display modes: (a) an extended desktop mode in which the display devices 110, 112 behave as if they were a single display device, with the display device 112 behaving as an extension of the display device 110 (b) a clone mode in which each of the display devices 110, 112 display the same content, or (c) a single display mode, e.g., one of the display devices 110, 112 displays content while the other display device is off (or blank) and does not display content. For example, single display mode may be used when the computing device is in a tablet orientation to turn off a particular display device (of the display devices 102, 104) that is not facing the user or is not visible to the user.

In the clone mode, first content 502 may be displayed on the first display device 102. The first content 502 may also be displayed on the second display device 104. Thus, in the clone mode, the same content 502 may be displayed on both display devices 102, 104.

Figure 6:
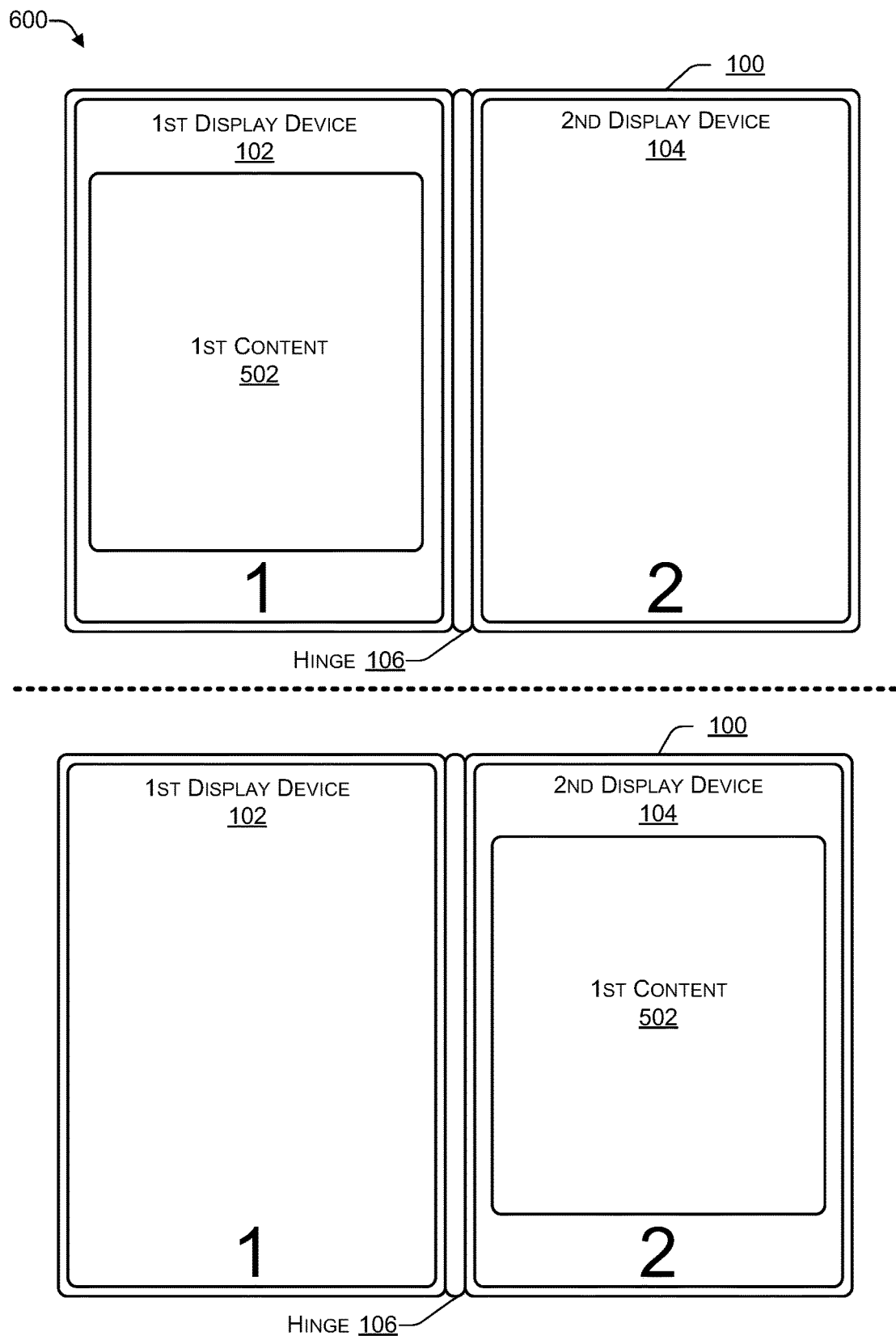
FIG. 6 is a block diagram illustrating a dual-display device in which the operating system is in a single display mode according to some embodiments.

FIG. 6 is a block diagram 600 illustrating a dual-display device in which the operating system is in a single display mode according to some embodiments. When an operating system of the computing device 102 of FIG. 1 is in the single display mode, the first content 502 may be displayed on either (but not both) of the first display device 102 or the second display device 104. For example, the first content 502 may be displayed on the first display device 102 and the second display device 104 may not display any content (e.g., the second display device 104 may be blank or off), as illustrated in the top of FIG. 6. As another example, the first content 502 may be displayed on the second display device 104 and the first display device 102 may not display any content (e.g., the first display device 102 may be blank or off), as illustrated in the bottom of FIG. 6.

The single display mode may be used when the computing device 100 is in one of the orientations 304 of FIG. 3 or 406, 402 of FIG. 4. In these orientations, the single display mode may reduce power consumption by turning off (or not displaying content on) whichever of the display devices 102, 104 is not facing the user. In addition, using the single display mode may prevent others in the surrounding area from viewing the content being displayed, thereby providing privacy and security when confidential information is being displayed.

Figure 7:
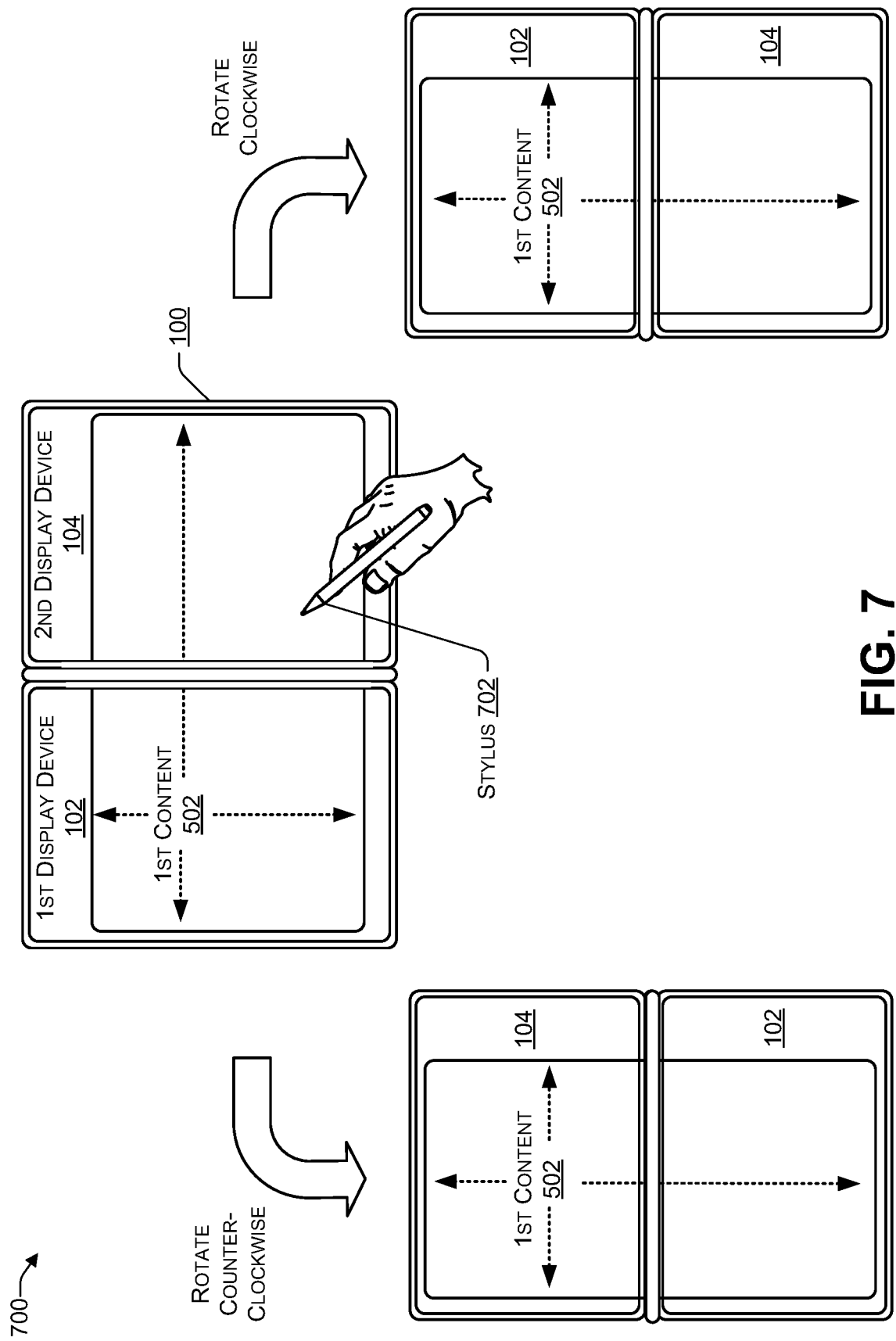
FIG. 7 is a block diagram illustrating a dual-display device in which the operating system is in an extended display mode displaying content that spans both display devices according to some embodiments.

FIG. 7 is a block diagram 700 illustrating a dual-display device in which the operating system is in an extended display mode with content spanning both display devices according to some embodiments. When the operating system of the computing device 102 of FIG. 1 is in the extended display mode, some content, such as the first content 502, may be displayed to span both the first display device 102 and the second display device 104. In some cases, additional content may be displayed on either or both of the first display device 102 or the second display device 104. The user may provide touch-input using a finger (or other appendage) or a touch-input device, such as a stylus 702.

When the user rotates the computing device 100 counter-clockwise, the computing device 100 may automatically re-position the first content 502, as illustrated in FIG. 7, by rotating the content 502 clockwise 90 degrees. When the user rotates the computing device 100 clockwise, the computing device 100 may automatically re-position the first content 502, as illustrated in FIG. 7, by rotating the content 502 clockwise 270 degrees. In this way, when the user re-positions (e.g., re-orients) the computing device 100, the content 502 may be rotated to display the first content 502 in a correct orientation relative to the user.

Figure 8:
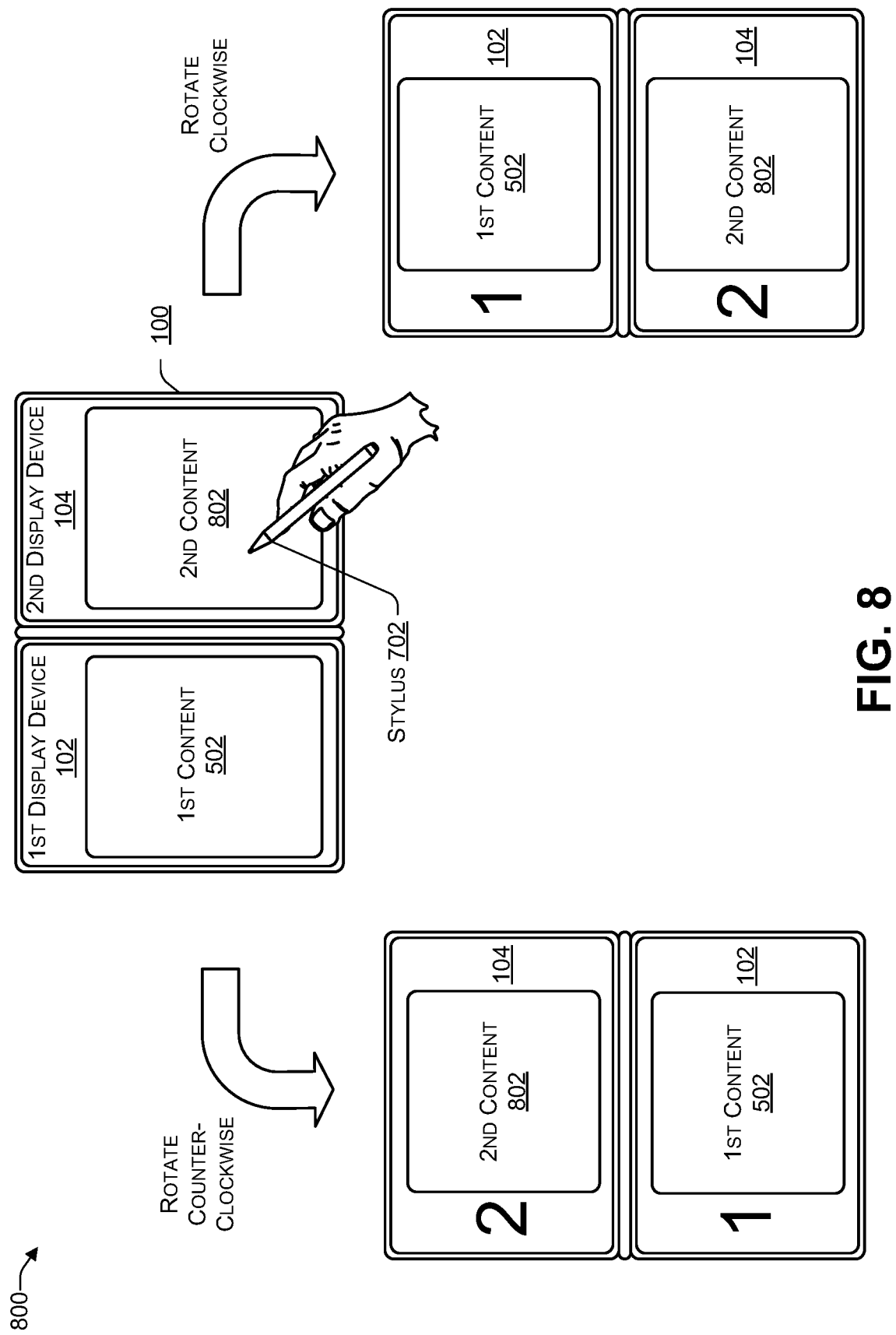
FIG. 8 is a block diagram illustrating a dual-display device in which the operating system is in an extended display mode displaying first content and second content according to some embodiments.

FIG. 8 is a block diagram 800 illustrating a dual-display device in which the operating system is in an extended display mode with first content and second content according to some embodiments. When the operating system of the computing device 102 of FIG. 1 is in the extended display mode, the first content 502 may be displayed on the first display device 102 and second content 802 may displayed on the second display device 104. In some cases, additional content may be displayed on either or both of the first display device 102 or the second display device 104. The user may provide touch-input using a finger (or other appendage) or a touch-input device, such as a stylus 702.

When the user rotates the computing device 100 counter-clockwise, the computing device 100 may automatically re-position the first content 502 and second content 802, as illustrated in FIG. 8, by rotating each of the content 502, 802 clockwise 90 degrees. When the user rotates the computing device 100 clockwise, the computing device 100 may automatically re-position the content 502, 802, as illustrated in FIG. 8, by rotating the content 502, 802 clockwise 270 degrees. In this way, when the user re-positions (e.g., re-orients) the computing device 100, the content 502, 802 may be rotated to a correct (e.g., viewable) orientation relative to the user.

Figure 9:
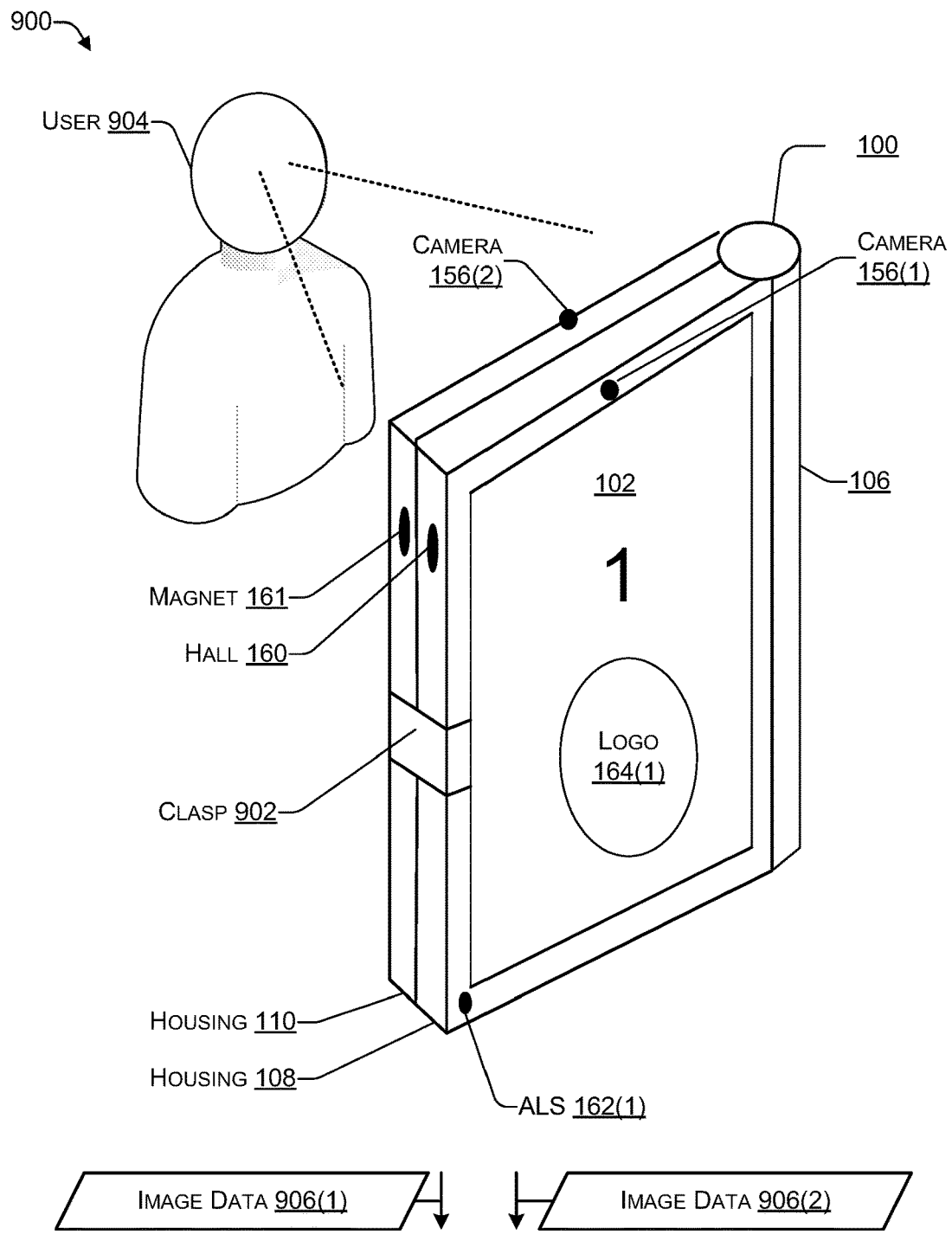
FIG. 9 is a block diagram illustrating determining an orientation of a dual-display device according to some embodiments.

FIG. 9 is a block diagram 900 illustrating determining an orientation of a dual-display device according to some embodiments. For example, the CPU 112 of FIG. 1 may receive the sensor data 168(1), 168(2) and determine an orientation of the computing device 100 and, in some cases, a location of a user 902.

In some implementations, to determine that the computing device 100 has been placed in a tablet orientation in which the first display device 102 is about 360 degrees relative to the second display device 104, the Hall-effect sensor 160 may be located at a first location in the first housing 108 and the magnet 161 may be located at a second location in the second housing 110. The first location and the second location may be such that, when the computing device 100 is placed in the tablet orientation, the Hall-effect sensor 160 is capable of detecting a presence of the magnet 161. The CPU 112 may receive sensor data 168(1) from the Hall-effect sensor 160 indicating the presence of the magnet 161, causing the CPU 112 of FIG. 1 to determine that the computing device 100 has been placed in a tablet orientation.

In some implementations, a clasp 902 may be used to temporarily secure the first housing 108 to the second housing 110 when the computing device 100 is placed in a tablet orientation (e.g., in which the first display device 102 is about 360 degrees relative to the second display device 104). The magnet 161 may be located at a location in the clasp 902 and the Hall-effect sensor 160 may be located at a location in the first housing 108. The locations may be such that, when the computing device 100 is placed in the tablet orientation and the clasp 902 used to secure the housing 108 to the housing 110, the Hall-effect sensor 160 is capable of detecting the presence of the magnet 161 in the clasp 902. The CPU 112 may receive sensor data 168(1) from the Hall-effect sensor 160 indicating the presence of the magnet 161, causing the CPU 112 of FIG. 1 to determine that the computing device 100 has been placed in a tablet orientation.

The CPU 112 of FIG. 1 may receive image data 906(1), 906(2) from the cameras 156(1), 156(2), respectively, and determine, using facial recognition software 908 whether the user 904 is facing the first display device 102 or the second display device 104. For example, the camera 156(1) may capture the image data 906(1) and the camera 156(2) may capture the image data 906(2). Using the facial recognition software 908, if the CPU 112 determines that the image data 906 includes a face of the user 904 (e.g., by determining that the image data 906(1) includes the stored facial data 910 of the user 904), then the CPU 112 may determine that user 904 is facing the first display device 102 and, in response, display the logo 164(2) on the second display device 104. If the CPU 112 determines that the image data 906(2) includes a face of the user 904 (e.g., by determining that the stored facial data 910 of the user 904 matches a portion of the image data 906(2)) then the CPU 112 may determine that the user 904 is facing the second display device 104 and, in response, display the logo 164(1) on the first display device 102, e.g., as illustrated in FIG. 9. For example, a user associated with the computing device 100 may store facial data to create the stored facial data 910. The stored facial data 910 may be used to perform a biometric login to the computing device 100 based on comparing the image data 906 with the stored facial data 910. The facial recognition software 908 may analyze the image data 906 to determine if the image data 906 includes the stored facial data 910 to determine which of the display devices 102, 104 the user 904 is facing. The CPU 112 may determine an intensity (e.g., brightness) of the logo 164(1) based on sensor data received from the ALS 162(1).

Figure 10:
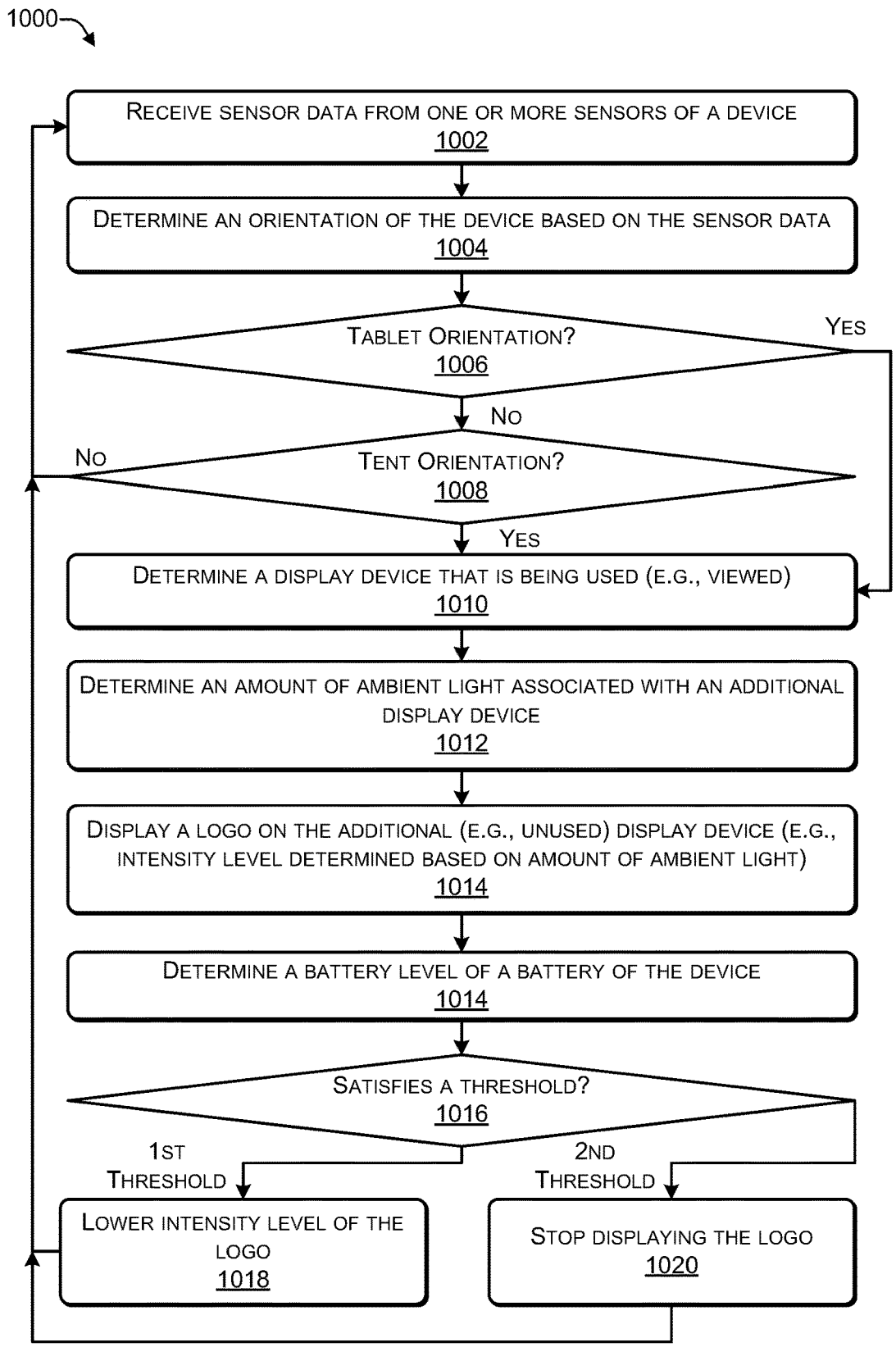
FIG. 10 is a flowchart of a process that includes displaying a logo on a first display device of a according to some embodiments.

In the flow diagram of FIG. 10, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 1000 are described with reference to FIGS. 1, 2, 3, 4, 5, 6, 7, 8, and 9 as described above, although other models, frameworks, systems and environments may be used to implement this process.

FIG. 10 is a flowchart of a process 1000 that includes displaying a logo on a first display device of a according to some embodiments. The process 1000 may be performed by the CPU 112 of FIG. 1.

At 1002, the process may receive sensor data from one or more sensors of a device. At 1004, an orientation of the device may be determined based on the sensor data. For example, in FIG. 1, the CPU 112 may receive the sensor data 168 from the sensors 146, 148 and determine an orientation (e.g., one of the orientations 302, 304 of FIG. 3, or 402, 404, 406, 408 of FIG. 4) of the computing device 100.

If a determination is made, at 1006, that the device has a tablet orientation, then the process may proceed to 1010. If a determination is made, at 1006, that the device does not have a tablet orientation, then the process may proceed to 1008. If a determination is made, at 1008, that the device has a tent orientation, then the process may proceed to 1010. If a determination is made, at 1008, that the device does not have a tent orientation, then the process may proceed to 1002, where additional sensor data may be received from the one or more sensors of the device. For example, in FIGS. 1, 3, and 4, if the CPU 112 determines that the computing device 100 is in the vertical tablet orientation 304, the tent orientation 402, or the horizontal orientation 406, then the process may proceed to 1010. If the CPU 112 determines that the computing device 100 is not in any of the vertical tablet orientation 304 the tent orientation 402, or the horizontal orientation 406, then the process may proceed to 1002.

At 1010, the process may determine which display device (of multiple display devices) is being viewed by a user. For example, in FIGS. 1 and 9, the CPU 112 may receive the sensor data 146, 148 from the cameras 156(1), 156(2) and use facial recognition software to determine whether the use 904 is facing the first display device 102 or the second display device 104.

At 1012, the process may determine an amount of ambient light associated with an additional display device (of the multiple display devices). At 1014, the process may display a logo on the additional display device (e.g., an intensity level of the logo may be determined based on the amount of ambient light). For example, in FIGS. 1 and 9, the CPU 112 may receive the sensor data 146 from the ALS 162(1) and display the logo 164(1) on the first display device 102 with an intensity based on the sensor data 146.

At 1014, the process may determine a battery level of a battery of the device. At 1016, a determination may be made whether the battery level satisfies one or more thresholds. If the process determines, at 1016, that the battery level satisfies a first threshold (e.g., less than N % battery level, such as N=50%, 40%, 30%, or the like), then the process may proceed to 1018, where an intensity level of the logo may be reduced (e.g., to reduce power consumption), and the process may proceed to 1002. If the process determines, at 1016, that the battery level satisfies a second threshold (e.g., less than M % battery level, such as M=20%, 10%, 5%, or the like), then the process may proceed to 1020, where the logo may not be displayed (e.g., to reduce power consumption), and the process may proceed to 1002. For example, the CPU 112 may determine a battery level associated with the battery 154. If the battery level satisfies a first threshold (e.g., 50%, 40%, 30% or the like) then the CPU 112 may reduce an intensity of the logo 164 to reduce power consumption. If the battery level satisfies a second threshold that is less than the first threshold (e.g., 20%, 10%, 5% or the like) then the CPU 112 may stop displaying the logo 164 to further reduce power consumption.

Figure 11:
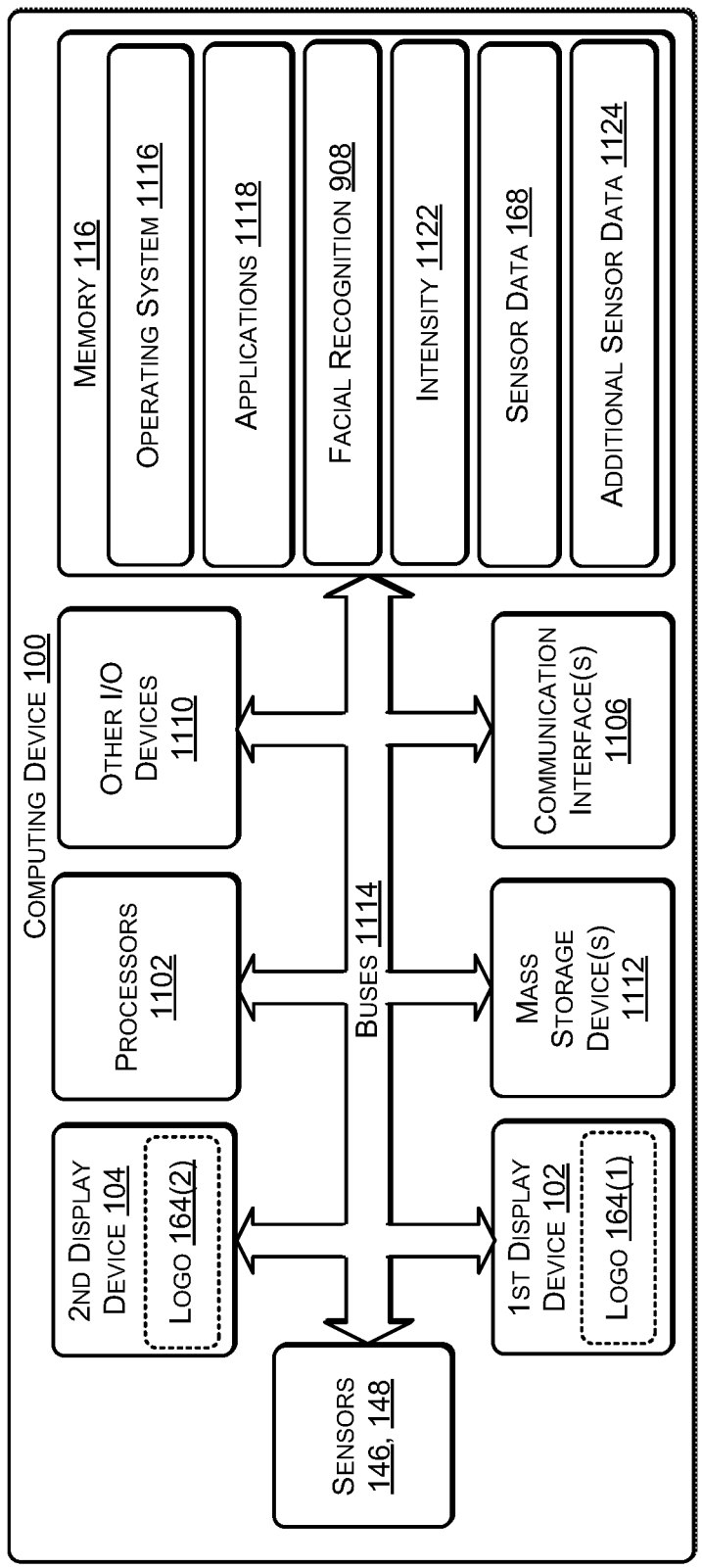
FIG. 11 illustrates an example configuration of a computing device that can be used to implement the systems and techniques described herein.

FIG. 11 illustrates an example configuration of the computing device 100 of FIG. 1 that can be used to implement the systems and techniques described herein. The computing device 100 may include one or more processors 1102 (e.g., the CPU 112 and the GPU 114 of FIG. 1), the memory 116, communication interfaces 1106 (e.g., including the I/O ports 120), the display devices 108, 110, other input/output (I/O) devices 1110 (e.g., keyboard, trackball, and the like, such as the additional components 144), and one or more mass storage devices 1112 (e.g., including the memory 116), configured to communicate with each other, such as via one or more system buses 1114 (e.g., including the data bus 128, 130) or other suitable connections. While a single system bus is illustrated for ease of understanding, it should be understood that the system buses 1114 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 1102 are one or more hardware devices that may include a single processing unit or a number of processing units, all of which may include single or multiple computing units or multiple cores. The processors 1102 may include the GPU 114 integrated into the CPU 112 or the GPU 114 may be a separate processor device from the CPU 112. The processors 1102 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 1102 may be configured to fetch and execute computer-readable instructions stored in the memory 116, mass storage devices 1112, or other computer-readable media.

Memory 116 and mass storage devices 1112 are examples of computer storage media (e.g., memory storage devices) for storing instructions that can be executed by the processors 1102 to perform the various functions described herein. For example, memory 116 may include both volatile memory and non-volatile memory (e.g., RAM, ROM, or the like) devices. Further, mass storage devices 1112 may include hard disk drives, solid-state drives, removable media, including external and removable drives, memory cards, flash memory, floppy disks, optical disks (e.g., CD, DVD), a storage array, a network attached storage, a storage area network, or the like. Both memory 116 and mass storage devices 1112 may be collectively referred to as memory or computer storage media herein, and may be any type of non-transitory media capable of storing computer-readable, processor-executable program instructions as computer program code that can be executed by the processors 1102 as a particular machine configured for carrying out the operations and functions described in the implementations herein.

The computing device 100 may also include one or more communication interfaces 1106 for exchanging data via a network. The communication interfaces 1106 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 1106 can also provide communication with external storage, such as a storage array, network attached storage, storage area network, the cloud storage 232, or the like.

The display devices 102, 104 may be located in the housings 108, 110, respectively, and may be connected using one or more hinges (e.g., the hinges 106 of FIG. 1). The hinges may enable each display device to be placed at an angle between about 0 and about 360 relative to the other display device. For example, the display devices 108, 110 may be used for displaying information and images to users. Other I/O devices 1110 may be devices that receive various inputs from a user and provide various outputs to the user, and may include a keyboard, a touchpad, a mouse, a printer, audio input/output devices, and so forth.

The computer storage media, such as memory 116 and mass storage devices 1112, may be used to store software and data. For example, the computer storage media may be used to store an operating system 1116, one or more applications 1118, the facial recognition application 908, the sensor data 168, an intensity level 1122 (e.g., associated with one of the logos 164(1), 164(2)), and additional sensor data 1124.

Thus, the dual-display computing device 100, may include various sensors 146, 148. The CPU 112 may receive the sensor data 168 from the sensors 146, 148 when one or more of the sensors 146, 148 detect a change in orientation, e.g., when user picks up and holds the device, when the user places the device on a surface (e.g., of a table), when an angle between the display devices 102, 104 changes, and the like. As the CPU 112 receives the sensor data 168 from the sensors 146, 148, the CPU 112 may repeatedly determine a current orientation of the computing device 100.

When the CPU 112 determines that the current orientation of the device is an orientation in which an embossed logo (e.g., an external permanent logo) is not visible to other users, the CPU 112 may display the logo 164 (e.g., a corporate logo or another type of graphical image) on whichever of the display devices 102, 104 is not being viewed by a user. For example, in the tablet orientation 304 (of FIG. 3) or 406 (of FIG. 4), the first display device 102 is rotated about 360 degrees relative to the second display device 104, enabling the user to view one of the display devices 102, 104. In this orientation, one of the display devices 102, 104 faces away from the user and is therefore not viewable by the user. In this orientation, the CPU 112 may display the logo 164 on one of the display devices 102, 104 that is facing away from or is not viewable by the user (e.g., as illustrated in FIG. 9).

The CPU 112 may determine the orientation (e.g., as illustrated in FIGS. 3 and 4) of the computing device 100 and determine whether to display the logo 164. For example, as illustrated in FIG. 9, the housing 108 may include the magnet 161 and the housing 110 may include the Hall-effect (or other magnetically sensitive) sensor 160, such that when the display device 102 is rotated about 360 degrees relative to the second display device 104, the Hall-effect sensor 160 detects the presence of the magnet 161 and sends the sensor data 168 to the CPU 112. In response, the CPU 112 may determine that the computing device 100 has been placed in a tablet orientation (304 of FIG. 3 or 406 of FIG. 4). As another example, the computing device 100 may include the clasp 902, such that when the housing 110 is rotated about 360 degrees relative to the housing 108, the clasp 902 may be used to temporarily secure the housing 108 to the housing 110. The clasp may include the magnet 161 and one of the housings 108, 110 of the computing device 100 may include the Hall-effect sensor 18—to sense the presence of the magnet 161 when the clasp is engaged 902. In response to receiving the sensor data from the Hall-effect sensor 160, the CPU 112 may determine that the computing device 100 has been placed in the tablet orientation (304 of FIG. 3 or 406 of FIG. 4).

The gyro sensor 158 may provide gyro data (included in the sensor data 168) to the CPU 112. Based on the gyro data, if the CPU 112 determines that the longest edge (e.g. length) of the display devices 102, 104 is approximately parallel to the earth's surface, the CPU 112 may determine that the computing device 100 has a horizontal orientation and display the logo 164 accordingly, e.g., such that the logo 164 is horizontally oriented for a second user viewing the display device 102 or 104 that displaying the logo 164. Based on the gyro data, if the CPU 112 determines that the longest edge (e.g. length) of the display devices 102, 104 is approximately perpendicular to the earth's surface, the CPU 112 may determine that the computing device 100 has a vertical orientation and display the logo 164 accordingly, e.g., such that the logo 164 is vertically oriented for a second user viewing whichever of the display devices 102, 104 is displaying the logo 164.

The bezel 206 of FIG. 2 surrounding each display device 102, 104 may include an imaging sensor (e.g., the camera 156). The CPU 112 may receive image data (e.g., sensor data) from each of the cameras 156 and determine (e.g., based on the facial recognition application 908) which one of the display devices 102, 104 the user is facing. For example, if an image (e.g., sensor data) provided by one of the cameras 156 includes a face, then the CPU 112 may determine that the user is facing the particular screen. If an image (e.g., sensor data) provided by a camera embedded in a bezel surrounding a particular display device of the display devices 102, 104 does not include a face, then the CPU may determine that the user 904 of FIG. 9 is not facing the particular display device.

The CPU 112 may receive ambient light data (sensor data) from the ALS 162 indicating an amount of ambient light striking the particular display device that is not being viewed by the user 904. Based on the ambient light data, the CPU 112 may determine an intensity (e.g., a brightness level) with which to display one of the logos 164. For example, when the computing device 100 is located in a relatively dark environment where the amount of ambient light is relatively low (e.g., a darkened room, outside at night, or the like), the CPU 112 may display one of the logos 164 with a relatively low intensity level, e.g., to reduce power consumption and prolong battery life. When the computing device 100 is located in a relatively well-lit environment where the amount of ambient light is relatively high (e.g., a room in which the lights are on, outside during a sunny day, or the like), the CPU 112 may display one of the logos 164 with a relatively high intensity level, e.g., to enable the logo to be seen by others in the environment. If the computing device 100 uses organic light emitting diode (OLED) panels as the display devices 102, 104, then, when one of the logos 164 is displayed, only the pixels used to display the logo 164 consume energy while the remaining pixels do not consume power. Thus, displaying the logo 164 at a high intensity in a relatively well-lit environment may not consume a relatively large amount of power.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   determining, by a computing device comprising a first display device coupled to a second display device by one or more hinges, that the computing device has moved from a first orientation to a second orientation, wherein the one or more hinges enable the first display device to be placed at an angle between about 0 degrees to about 360 degrees relative to the second display device;
   determining, by the computing device, that the second orientation comprises a particular orientation in which the second display device is not visible to a user;
   determining, by the computing device, that the user is viewing the first display device;
   displaying, by the computing device, a graphical image comprising a corporate logo having a particular brightness amount on the second display device;
   determining a remaining battery level of a battery that is powering the computing device;
   in response to determining that the remaining battery level satisfies a first threshold, reducing the particular brightness amount of the corporate logo; and
   in response to determining that the remaining battery level satisfies a second threshold, not displaying the corporate logo.

2. The method of claim 1, wherein:
   in the second orientation, the first display device is facing in a first direction towards the user and the second display device is facing in a second direction that is away from the user.

3. The method of claim 1, wherein determining that the user is viewing the first display device comprises:
   receiving first image data from a first imaging sensor located in a first bezel of the first display device;
   determining, using a facial recognition application, that the first image data includes a face of the user; and
   determining that the user is viewing the first display device.

4. The method of claim 1, wherein determining that the user is viewing the first display device comprises:
   receiving second image data from a second imaging sensor located in a second bezel of the second display device;
   determining, using a facial recognition application, that the second image data excludes a face of the user;
   determining that the user is not viewing the second display device; and
   determining that the user is viewing the first display device.

5. The method of claim 1, further comprising:
   receiving, from an ambient light sensor located in a bezel of the second display device, ambient light data indicating an amount of ambient light falling on the second display device; and determining, based on the ambient light data, the particular brightness level.

6. The method of claim 1, wherein the second orientation comprises one of:
a tablet orientation; or
a tent orientation.

7. The method of claim 1, further comprising:
determining that the computing device has been rotated about 90 degrees; and
rotating the graphical image about 90 degrees.

8. A computing device comprising:
a first display device;
a second display device;
one or more hinges coupling the first display device to the second display device, wherein the one or more hinges enable the first display device to be placed at an angle between about 0 degrees to about 360 degrees relative to the second display device;
a first bezel of the first display device, the first bezel comprising a first imaging sensor and a first ambient light sensor;
a second bezel of the second display device, the second bezel comprising a second imaging sensor and a second ambient light sensor;
one or more processors;
one or more non-transitory computer readable media storing instructions executable by the one or more processors to perform operations comprising:
determining that the computing device has moved from a first orientation to a second orientation;
determining that the second display device is not being viewed in the second orientation;
displaying a graphical image on the second display device, wherein the graphical image comprises a corporate logo having a particular brightness amount;
determining a remaining battery level of a battery that is powering the computing device;
in response to determining that the remaining battery level satisfies a first threshold, reducing the particular brightness amount of the corporate logo; and
in response to determining that the remaining battery level satisfies a second threshold, not displaying the corporate logo.

9. The computing device of claim 8, further comprising:
a Hall-effect sensor; and
a magnet; and
wherein the operations further comprise:
determining that the Hall-effect sensor has detected the magnet; and
determining that the second orientation comprises a tablet orientation.

10. The computing device of claim 8, wherein determining that the second display device is not being viewed comprises:
receiving first image data from the first imaging sensor;
determining, using a facial recognition application, that the first image data includes a face of a user of the computing device;
determining that the first display device is being viewed by the user; and
determining that the second display device is not being viewed by the user.

11. The computing device of claim 8, wherein determining that the second display device is not being viewed comprises:
receiving image data from the second imaging sensor;
determining, using a facial recognition application, that the image data excludes a face of the user associated with the device; and
determining that the second display device is not being viewed by the user.

12. The computing device of claim 8, further comprising:
determining, using the second ambient light sensor, an amount of ambient light falling on the second display device; and
determining, based on the amount of the ambient light falling on the second display device, the particular brightness amount with which to display the graphical image,
wherein the graphical image comprises the corporate logo of a manufacturer of the computing device.

13. The computing device of claim 8, wherein the operations further comprise:
determining that the computing device has been rotated about 90 degrees; and
rotating the graphical image about 90 degrees.

14. One or more non-transitory computer-readable media storing instructions that are executable by one or more processors to perform operations comprising:
determining, by a computing device comprising a first display device coupled to a second display device by one or more hinges, that the computing device has moved from a first orientation to a second orientation, wherein the one or more hinges enable the first display device to be placed at an angle between about 0 degrees to about 360 degrees relative to the second display device;
determining that second display device is not being viewed in the second orientation;
displaying a graphical image on the second display device, wherein the graphical image comprises a corporate logo having a particular brightness amount;
determining a remaining battery level of a battery that is powering the computing device;
in response to determining that the remaining battery level satisfies a first threshold, reducing the particular brightness amount of the corporate logo; and
in response to determining that the remaining battery level satisfies a second threshold, not displaying the corporate logo.

15. The one or more non-transitory computer-readable media of claim 14, wherein the operations further comprise:
receiving sensor data from a Hall-effect sensor indicating a presence of a magnet; and
determining that the second orientation comprises a tablet orientation.

16. The one or more non-transitory computer-readable media of claim 14, wherein determining that the second display device is not being viewed comprises:
receiving first image data from a first imaging sensor located in a first bezel of the first display device;
determining, using facial recognition software, that the first image data includes a face of a user that is associated with the computing device;
determining that the first display device is being viewed; and
determining that the second display device is not being viewed.

17. The one or more non-transitory computer-readable media of claim 14, wherein determining that the second display device is not being viewed comprises:

receiving second image data from a second imaging sensor located in a second bezel of the second display device;

determining, using facial recognition software, that the second image data excludes a face of the user; and determining that the second display device is not being viewed by the user.

18. The one or more non-transitory computer-readable media of claim 14, wherein the second orientation comprises one of:

a tablet orientation; or a tent orientation.

19. The one or more non-transitory computer-readable media of claim 14, further comprising:

receiving, from an ambient light sensor, ambient light data indicating an amount of ambient light falling on the second display device; and determining, based on the ambient light data, the particular brightness amount with which to display the graphical image.

20. The one or more non-transitory computer-readable media of claim 14, the operations further comprising:

determining that the computing device has been rotated about 90 degrees; and rotating the graphical image about 90 degrees.

* * * * *